United States Patent
Wu et al.

(10) Patent No.: US 6,586,292 B2
(45) Date of Patent: Jul. 1, 2003

(54) GUARD MESH FOR NOISE ISOLATION IN HIGHLY INTEGRATED CIRCUITS

(75) Inventors: Ping Wu, Cupertino, CA (US); Chinpo Chen, Milpitas, CA (US)

(73) Assignee: Broadcom Corporation, Irvine, CA (US)

(*) Notice: Subject to any disclaimer, the term of this patent is extended or adjusted under 35 U.S.C. 154(b) by 0 days.

(21) Appl. No.: 10/177,229

(22) Filed: Jun. 22, 2002

(65) Prior Publication Data

US 2002/0164851 A1 Nov. 7, 2002

Related U.S. Application Data

(62) Division of application No. 09/523,558, filed on Mar. 12, 2000, now Pat. No. 6,424,022.
(60) Provisional application No. 60/124,003, filed on Mar. 12, 1999.

(51) Int. Cl.[7] .......................................... H01L 21/8238
(52) U.S. Cl. ...................... 438/215; 257/432; 257/48; 257/547; 257/659

(58) Field of Search ............................. 438/215; 257/48, 257/432, 547, 659, 394, 901, 370, 374, 376, 397, 398

(56) References Cited

U.S. PATENT DOCUMENTS

| | | | | |
|---|---|---|---|---|
| 4,470,062 A | * | 9/1984 | Muramatsu | 257/513 |
| 5,475,255 A | * | 12/1995 | Joardar et al. | 257/547 |
| 5,525,824 A | * | 6/1996 | Himi et al. | 257/370 |
| 2002/0148967 A1 | * | 10/2002 | Iwanczyk et al. | 250/370.11 |

* cited by examiner

Primary Examiner—Wael Fahmy
Assistant Examiner—Nathan W. Ha

(57) ABSTRACT

A methodology of creating integrated circuits with improved noise isolation is presented. The circuitry of an integrated circuits is separated into noise generating circuit blocks and noise sensitive circuit blocks. N-type and P-type diffusion guard rings are placed around each of the circuit blocks. Substantially overlying the N-type and P-type diffusion guard rings are power supply meshes which are intimately in contract with the guard rings below through spaced apart vias. The power supply meshes not only supply power for the circuit blocks, but also reverse-bias the diffusion guard rings for improved noise isolation.

9 Claims, 11 Drawing Sheets

GUARD MESH FOR NOISE ISOLATION IN HIGHLY INTEGRATED CIRCUITS

CROSS-REFERENCES TO RELATED APPLICATIONS

The present application claims priority from U.S. patent Appln. Ser. No. 09/523,558, filed Mar. 12, 2000, now U.S. Pat. No. 6,424,022; which claims priority from Provisional Patent Application No. 60/124,003, filed Mar. 12, 1999; all of which are hereby incorporated by reference.

BACKGROUND OF THE INVENTION

This invention relates generally to the suppression of electrical noise propagated in the substrate of a semiconductor integrated circuit device, particularly for the case of a highly integrated device.

Semiconductor integrated circuit devices, particularly those having a high level of integration as in the case of the so-called systems-on-a-chip, are known to have both noise-generating circuit elements, as well as noise-sensitive circuit elements, on the same die. The noise-generating elements are typically digital circuits involving high-speed switching operations, such as DSP (Digital Signal Processing) or microprocessor core circuits, RAM (Random Access Memory), ROM (Read-Only Memory), line/bus drivers, I/O (Input/Output) drivers, etc. The noise-sensitive elements are typically analog circuits, such as A-D (Analog-to-Digital) or D-A (Digital-to-Analog) converters, filters, operational amplifiers, comparators, bias circuits, etc. Noise signals generated by the noisy elements propagate in the substrate to the noise-sensitive circuits as interference. The substrate noise interference level is a very important determinant of the degree of integration that is possible on a single die. An increase of the spacing between the noise generating elements and the noise sensitive elements is an obvious method for reduction of the noise interference level, but the degree of integration possible on a chip is thereby substantially reduced. One trend in semiconductor technology is toward smaller spaces between circuit elements. Another important trend is the integration of system functions into integrated circuits with the systems being integrated having widely differing characteristics of noise sensitivity and noise generation. Therefore the reduction of substrate noise in highly integrated semiconductor devices is of paramount importance.

Often, the methods and apparatuses used for substrate noise reduction require expensive changes to conventional semiconductor manufacturing processes, such as grooves in the semiconductor device as in U.S. Pat. No. 4,470,062, and electroconductive walls as in U.S. Pat. No. 5,196,920. In U.S. Pat. No. 5,475,255, Joarder et al. disclose a noise reduction technique that utilizes one or two guard rings that partially surround or completely surround each noise-generating circuit element or each noise-sensitive circuit element. Each guard ring and each circuit element is assigned separate connections to a common electrical ground external to the device. The approach is impractical for highly integrated devices because the number of circuit elements and guard rings can be very large and for the invention of Joarder et al. the number of device pins required for external ground connection increases linearly with the number of circuit elements and guard rings.

Previous patents have disclosed guard bands surrounding noise-generating or noise-sensitive regions (NG/NS regions) circuit portions having metal-diffusion contacts connecting to metal interconnection lines that are dedicated to particular package pins. Each of the separate noise-generating or noise-sensitive circuit portions are separately allocated separate package pins. The number of allocated package pins thus grows as more independent circuit portions are integrated onto a single IC chip. This soon becomes impractical for large, multifunctional highly integrated systems.

BRIEF SUMMARY OF THE INVENTION

Accordingly, the present invention provides for an apparatus and method for effective substrate noise reduction in highly integrated semiconductor devices without need for a substantial overhead in the number of device input/output pins required to support the noise suppression function. Further, the noise suppression apparatus and method of the invention employ inexpensive conventional semiconductor manufacturing processes. In the layout on the substrate, the circuits are partitioned into a plurality [Ng] of noise-generating [NG] regions and a plurality [Ms] of noise-sensitive [Sm] regions, where each noisy region contains a plurality of noise-generating circuit blocks and each noise-sensitive region contains a plurality of noise-sensitive circuit blocks. For each region an independent metal conductor power distribution mesh and an independent metal conductor ground distribution mesh is formed around the perimeter of the respective region and serves as common power supply and ground reference, respectively, for all the circuit blocks of the respective region. Each Gm and Sm region is embedded with a respective mesh of P+ noise guard bands and a respective mesh of N+ noise guard bands. The N+ mesh and the power distribution mesh are configured so that the power metal conductor distribution mesh overlies a substantial portion of the N+ guard band mesh. The power metal conductor distribution mesh is positioned above the N+ guard band mesh so that they may be easily connected through a plurality of spaced apart N+-to-power metal contact openings [also called vias] provided in the insulating layer (or layers) between them. The N+-to-power metal contact openings permit the power metal conductor to make solid electrically conducting contact to the N+ guard band diffusion beneath the corresponding vias between meshes.

Similarly, the P+ guard band mesh has a solid electrically conducting tie to the ground conductor metal distribution mesh through a respective plurality of spaced apart P+-to-ground metal vias positioned between the P+ and ground metal mesh above it in its respective region. The P+ mesh together with the ground mesh tied to it, and the N+ mesh together with the power mesh tied to it, are configured in each respective region such that each circuit block within a region is separated from adjacent blocks of the same region and separated from adjacent blocks of adjacent regions by both N+ and P+ guard bands. More specifically, Sm blocks are separated from Sm blocks and from Gm blocks by both N+ and P+ guard bands, and Gm blocks are separated from Sm blocks and from Gm blocks by both N+ and P+ guard bands. In this way each noise-sensitive circuit block is isolated from noisy circuit blocks by the guard bands.

One of the advantages of the present invention is that this invention leverages a feature that is becoming more common in chip layout of large integrated circuits. That is, metal conductor ground meshes and metal conductor power supply meshes are being used to distribute power and ground to different circuit regions merely for the purpose of maintaining uniform voltages over large, widely separated circuit regions. Thus the chip area that is already used by the power-ground distribution meshes merely for the uniform distribution of voltage, is advantageously used to contain the isolating guard bands at no additional penalty in chip area.

Along any lateral substrate path between a noise-generating bock and a noise-sensitive block, the alternating N+ and P+ guard bands substantially increase the impedance of the lateral paths by "pinching off" the thickness of the lateral path by the protrusion of their respective diffusion depths into the substrate. The P+ and N+ guard bands also act as effective sinks for noise generated in other regions and transmitted laterally along the substrate. Because the guard meshes are tied to the already existing power/ground distribution meshes for the regions, no significant overhead in additional external device pins is incurred to support the substrate noise suppression function. For a noisy region, the conductor metal connected guard meshes of each circuit block and each circuit region substantially confine noise generated by each noisy block to the local area of the block. For a noise-sensitive region, the guard meshes of the region substantially isolate each noise sensitive block from all residual externally generated noise from impinging on the block by transmission through the substrate.

The invention is described in its preferred embodiment as a CMOS device fabricated in an N-well process with a P-type substrate. The described method of the invention will be seen to extend in obvious ways to N-substrate CMOS, Triple-well CMOS, BiCMOS, and bipolar semiconductor technologies.

Another advantage of the present invention is the limited number of additional package pins required for effective noise isolation between Sm and Gm regions and between adjacent Sm—Sm blocks or adjacent Gm—Gm blocks is much less than the number of pins required by previous isolation methods. In contrast to prior methods, the present invention provides that sufficient noise isolation can be attained by having respective ground and power metal conductor meshes of individual Sm regions and individual Gm regions electrically connected on the IC chip to corresponding metal conductor meshes of one or more other corresponding individual Sm regions and individual Gm regions, rather than on the printed circuit board to which the IC chip is mounted. Such connections may be made at intermediate points of the IC chip circuit layout, or at a particular single chip-bonding pad connected to a particular single chip package pin. This is in contrast to prior methods which necessitated each noise isolated region be connected through its own, separate package pin before making a common connection to a metal conductor on the printed circuit board on which the IC was mounted, in order to achieve sufficient noise isolation between noisy and noise-sensitive regions or blocks.

DETAILED DESCRIPTION OF THE INVENTION

Figure 1A:
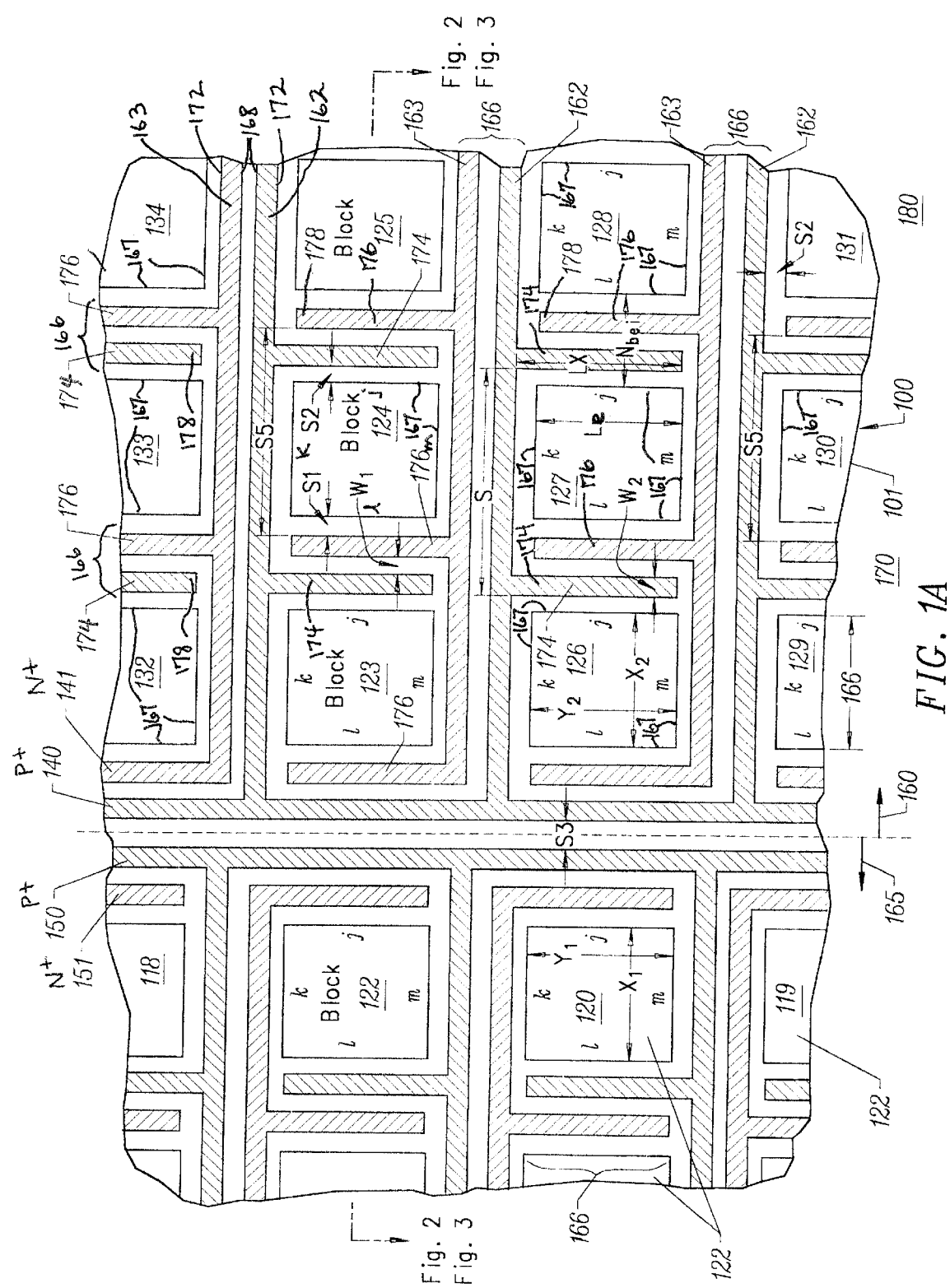
FIG. 1A illustrates a section of the die showing an example of the separated P+ and N+ guard mesh fingers and backbone configurations in accordance with the present invention.

An object of the present invention is to provide for an apparatus and method for improved substrate noise suppression for highly integrated circuits on a semiconductor die. The present invention can be fully described with reference to FIGS. 1–8. Referring to FIG. 1A, there is shown a plan view of an exemplary CMOS semiconductor die 100 according to the present invention. Arrows X and Y are shown to facilitate explanation of the relative locations of features shown in the drawings.

A representative region of the die 100 is depicted as being viewed through an opening 101 in an overlying insulator layer (not shown). The die 100 is formed having an underlying P-substrate 170. A plurality of noisy circuit function blocks (or elements) represented by blocks 123–134 are embedded in a region 160 of the die 100. The region 160 is termed a noisy region. Similarly, a plurality of noise-sensitive function blocks represented by blocks 118–122 are embedded in a region 165 of the die. The region 165 is termed a noise-sensitive region. The noisy blocks 123–134 represent any circuit elements which, when operating, generate or inject signals into the substrate 170, which signals are considered to be noise relative to the behavior of any one or more of the noise-sensitive blocks 118–122.

For example, a noisy block may represent a collection of high-speed logic gates, high frequency (fast rise time) clocks, I/O buffers, RAM, ROM, line driver, bus driver, etc. The noise-sensitive blocks 118–122 represent circuit elements that are adversely affected by the noise, e.g., analog circuits, such as filters, op amps, A-D or D-A converters, voltage comparators, bias circuits, reference generation circuits, etc. The die 100 of a highly integrated semiconductor device will generally contain multiple pluralities of different noisy blocks and regions, and noise-sensitive blocks and regions.

A first mesh 140 of P+ guard bands along with a related second mesh 141 of N+ (formed with N-well regions) guard bands are embedded in the P-substrate 170 of the noisy region 160. Additional P+ and related N+ meshes (described below) are defined in the noise-sensitive regions 165. The P+ and N+ guard bands are generally formed by implantation or diffusion of opposite polarity dopants (donor or acceptor) processes typical of the semiconductor industry.

One configuration of the first and second meshes 140, 141 is illustrated in FIG. 1A. The details of the configuration of meshes 140 and 141 are related to the number, location and type of the circuit blocks 123–134 in the noisy region. The configuration details of the N+ and P+ meshes 150 and 151 are also related to the number, location and type of the noise-sensitive circuit blocks 118–122 in the noise-sensitive region 165. Some aspects of the present invention relating to details of mesh configuration are described below.

The N+ and P+ meshes are configured according to the layout rules (widths and spaces) suitable for the technology being implemented. Examples of such layout rules are: N+-to-N+ spacing S1 (same doping type member spacing rule distance), N+-to-P+ spacing S2 (opposite dopant type member spacing rule distance), N+ mesh width W1 (same dopant member width rule distance), P+ mesh width W2 (alternate same dopant member width rule distance), and P+-to-P+ mesh spacing S3 (alternate same dopant type member spacing rule distance).

In the configuration illustrated in FIG. 1A, the P+ guard mesh 140 and N+ guard mesh 141 are arranged from respective interconnected pluralities of longitudinally (X) extending backbones 162, 163 and respective pluralities of integral and spaced apart (Y-extending) fingers projecting orthogonally therefrom. Adjacent pairs of longitudinally extending opposite dopant polarity backbones (i.e., P+ mesh backbones 162 and N+ mesh backbones 163) are spaced apart and disposed with proximally spaced adjacent guard band backbone edges 168 parallel to and facing toward one another, and distally spaced opposed guard band backbone edges 172 parallel to and facing away from one another. Respective related pluralities of spaced apart, same dopant polarity (i.e., P+ guard mesh fingers 174 joined to P+ mesh backbone 162 and related, spaced apart N+ guard mesh fingers 176 joined to N+ mesh backbone 163) are longitudinally disposed along each related facing edge (168, 172) of the adjacent pair of parallel backbones 162, 163.

Each finger 176, 174 is joined integrally at one respective proximal end to the respective facing edge of the respective adjacent backbone. Each finger extends outward from its proximal joined end and projects distally toward the opposite polarity backbone member to a respective distal finger end 178. Each distal finger end is spaced apart from its opposite polarity backbone member by the appropriate opposite polarity member spacing rule distance, i.e., N+-toP+ spacing S2.

Portions of oppositely extending, adjacent, opposite dopant polarity guard band fingers 174, 176 of the spaced apart P+ and N+ guard meshes 140, 141 are arranged to form coextending, spaced apart, nearest neighbor, opposed dopant polarity segment pairs 166 (guard band segment pairs). Nearest neighbor guard band segment pairs 166 are disposed in spaced apart relationship between two parallel adjacent facing edges 167 of pairs of adjacent noisy circuit blocks in the noisy circuit region 160.

Adjacent circuit blocks in integrated circuits are generally disposed with perimeters formed of a succession of contiguous orthogonal segments, with the simplest perimeter being a rectangle or in the limit, a square having four successive segments (sides) with equal length (e.g., four sides of equal length, Le, where each side is enumerated successively as j, k, l, m with four corresponding corners at intersections of successive sides indicated by jk, kl, lm, and mj). The circuit blocks in the following figures are shown essentially as squares and are referenced as having sides j, k, l, m, referencing from j in a positive X-direction (i.e., at 3 o'clock with FIG. 1A being right-reading) and proceeding counter-clockwise to side m at 6 o'clock). Spaced apart, adjacent circuit blocks in substantially all typical integrated circuits typically have parallel adjacent facing edges extending parallel by a length, Le, defining a block edge dimension as shown in the configuration of FIG. 1A. It is not always the case that the adjacent circuit blocks have parallel facing edges formed from rectangular bodies but this example serves to illustrate an embodiment of the present invention. Alternative topologies of adjacent circuit blocks having non-parallel, non-linear facing segments still can be considered to be covered by the present invention as described.

A first feature of the present invention is shown by inspecting adjacent spaced apart circuit blocks, e.g., circuit block 127 which is surrounded by four adjacent circuit blocks 128, 124, 126 and 130. Each surrounding circuit block is separated from the block 127 by interposed N+, P+ guard bands that are uniquely interconnected to reduce noise transmission between the adjacent blocks. FIG. 1A depicts the circuit blocks 127, 128, 124, 126 and 130 with square perimeters in the plane of the circuit, with the perimeters forming the two sets of opposed parallel sides j, l and k, m. The sides j, l extend in the Y-direction, and the sides k, m in the X-direction. The nearest adjacent circuit blocks are arranged for the purpose of this description so that the equally sized square circuit blocks have parallel adjacent facing edges (167), such as j-l, k-m with co-extending equal lengths, Le. Reference is made to other pairs of co-extending, parallel, equal length edges using the same terminology (i.e., parallel adjacent facing edge or edges 167) where distinction is clear by the context.

The Y-directed parallel adjacent facing edges 167 of the blocks 127 and 128 are separated in the X-direction by a first Y-directed P+, N+ nearest neighbor segment pair 166. The Y-directed parallel adjacent facing edges 167 of the blocks 127 and 126 are separated in the X-direction by a second Y-directed P+, N+ nearest neighbor segment pair 166. The X-directed parallel adjacent facing edges 167 of the blocks 127 and 124 are separated in the Y-direction by a first X-directed P+, N+ nearest neighbor segment pair 166. The X-directed parallel adjacent facing edges 167 of the blocks 127 and 130 are separated in the Y-direction by a second X-directed P+, N+ nearest neighbor segment pair 166.

Separation of the Blocks 127 and 128.

The first Y-directed segment pair 166 (i.e., one of the guard band segment pairs) is formed from portions of oppositely extending Y-directed guard mesh fingers 174, 176) is disposed in spaced apart, parallel relationship between the adjacent parallel block edges 167 (i.e., the edges j, l) of the blocks 127, 128 respectively.

Separation of the Blocks 127 and 126.

The second Y-directed segment pair 166 is formed from portions of oppositely extending Y-directed guard mesh fingers 174, 176 disposed in spaced apart, parallel relationship between the adjacent parallel block edges 167 (i.e., the edges j, l) of the blocks 126, 127 respectively.

Separation of the Blocks 127 and 124.

The first X-directed segment pair 166 (i.e., one of the guard band segment pairs) is formed from portions of oppositely extending X-directed guard mesh backbones 162, 163, and is disposed in spaced apart, parallel relationship between the adjacent parallel block edges 167 (i.e., edges k, m) of the blocks 127, 124 respectively.

Separation of the Blocks 127 and 130.

The second X-directed segment pair 166 (i.e., one of the guard band segment pairs) is formed from portions of oppositely extending X-directed guard mesh backbones 162, 163, and is disposed in spaced apart, parallel relationship between the adjacent parallel block edges 167 (i.e., the edges m, k) of the blocks 127, 130 respectively.

The parallel adjacent facing edges 167 are spaced according to the spacing and width layout rules for the technology of interest (e.g., S1, S2, W1, W2, as described above) in which one circuit block has an edge length, Le, parallel and spaced apart according to the spacing and width rules from an adjacent circuit block. Each successive side j, k, l, m of the circuit block 127 is thus separated from its four nearest surrounding adjacent neighbor circuit block 128, 124, 126, 130 respectively by four respective pairs of isolating P+, N+ guard band segments 166. Two of the pairs of Y-directed segments 166 are formed from portions of oppositely Y-directed P+, N+ guard mesh fingers 174, 176 integrally connected at respective spaced apart opposite ends to respective spaced apart P+, N+ guard mesh backbones 162, 163. The respective spaced apart P+, N+ guard mesh backbones 162, 163 are disposed orthogonal to their respective connected guard mesh fingers 174, 176. The respective spaced apart P+, N+ guard mesh backbones 162, 163 extend longitudinally in the X-direction to make integral connection with like orthogonal guard mesh fingers 174, 176 extending in the Y-direction and forming like pairs of isolating P+, N+ guard band segments 166 between other adjacent noisy circuit blocks; i.e., 126 to 127 and 128 to an adjacent block (not shown).

Two other pairs of X-directed segments 166 are formed from X-directed portions of the guard mesh 140, 141. Specifically, one pair of X-directed segments 166 separates the side k of the circuit block 127 from the side m of the circuit block 124. This one pair 166 is formed from X-directed portions of a first adjacent pair of the longitudinally extending P+, N+, guard band backbones 162, 163 between the k side of the circuit block 127 and the m side of the block 124. The P+ dopant type member backbone 162 faces one parallel adjacent facing edge 167 (e.g., the side k) of the block 127 and the N+ dopant type member 163 faces opposite the opposed parallel adjacent facing edge 167 (e.g., the side m) of the block 124. The other pair of X-directed segments 166 separate the side m of the circuit block 127 from the side k of the circuit block 130. This other pair 166 is formed from X-directed portions of another adjacent pair of the longitudinally extending P+, N+, guard band backbones 162, 163 between the circuit blocks 127 and 130. Each one of the two members of the X-directed guard band segment pair 166 extends laterally between the two parallel adjacent facing edges (k, m) to a length, corresponding to the length, Le, of the parallel adjacent facing edge of the block (i.e., k and/or m).

Each one of the two members of the Y-directed guard band segment pair 166 also extends proximally and distally to make contiguous and continuous integral contact with the respective X-directed backbone 162, 163 where its respective proximal and distal end join with its corresponding integral backbone. The distal ends 178 of the Y-directed guard band segment members 174, 176 in the configuration of FIG. 1A are shown as terminating co-linearly with an orthogonal successor edge of the corresponding spaced apart adjacent block edge (i.e., side k and m). Thus each member (the fingers 174, 176) of the guard band segment pairs 166 has a length at least as long as the length, Le, of the nearest parallel adjacent facing edge of the adjacent circuit block (sides j, l). Since each one of the guard band segment pair members extends proximally and is joined to its corresponding same polarity backbone, they each have a total proximal-to-distal length Lx at least equal to Le plus the distance of the appropriate topology spacing rule, e.g., N+-to-P+ spacing rule, i.e., Le+S2. This comes from the requirements of the spacing and width rules, that the N+ circuit blocks 127, 128 must be spaced from the P+, N+ guard bands by the applicable rule distance, i.e., S2, S1.

By inspection, it is apparent that Y-directed, parallel adjacent facing edges of N+ circuit blocks 126 and 127 are identically separated and spaced apart from each other in the X-direction by another set of Y-directed guard band segment pairs 166 (another pair of adjacent oppositely extending guard band fingers 174, 176). According to the layout rules for the technology used, they have identical minimum spacing, lengths and connection to the respective backbones 163, 162. The circuit block 127 is thus bounded on both of its opposed sides (j, l and k, m) by two oppositely adjacent guard band segment pairs 166 that separated and isolate it from the adjacent circuit blocks.

By inspection it is easily seen that each of the noisy circuit blocks 123–134 is separated from its nearest adjacent neighbor circuit block by at least two guard band segments of the guard mesh 140, 141.

Although it is not shown in FIG. 1A, it is apparent that the each member of the guard band segment pairs may extend distally further beyond the extent of the facing block edge, Le, to a more distal length if it is necessitated by some other circuit topology feature, as long as the topology spacing and width rules are followed. Each of the two opposite dopant type members of the guard band segment pairs thus extend laterally as guard bands for the entire length of the facing edge of the nearest noisy circuit block. As shown below, this has great effect in reducing the transmission of noise generated within the enclosed circuit block, to another circuit block, whether very close, i.e., to its nearby adjacent circuit block neighbor, or to a more distant neighbor circuit block.

Figure 1B:
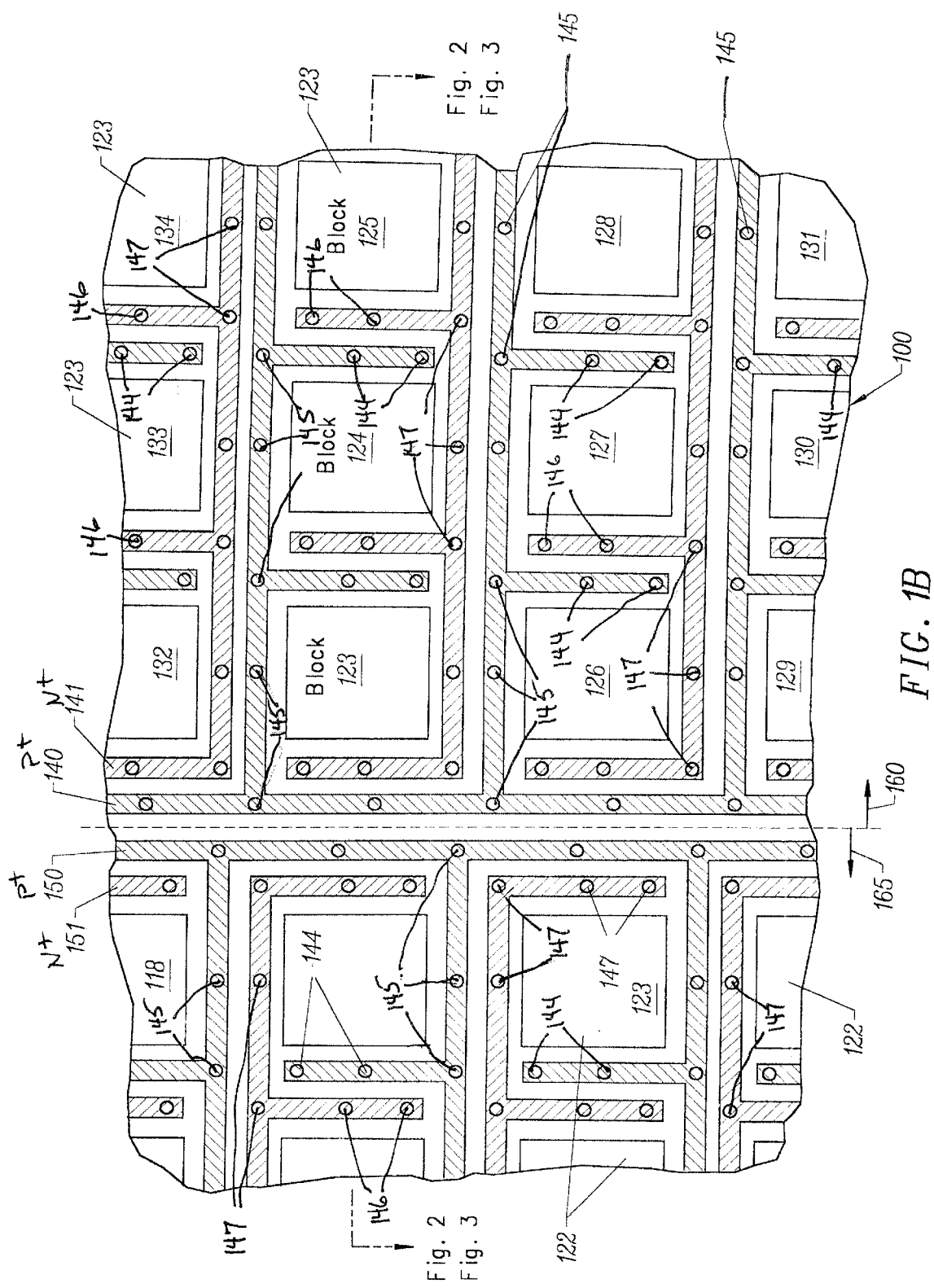
FIG. 1B depicts contact openings (vias) for interconnecting continuous guard mesh power and ground metal patterns to separated P+ and N+ guard mesh fingers and backbone for the configurations of FIG. 1A.
Figure 1C:
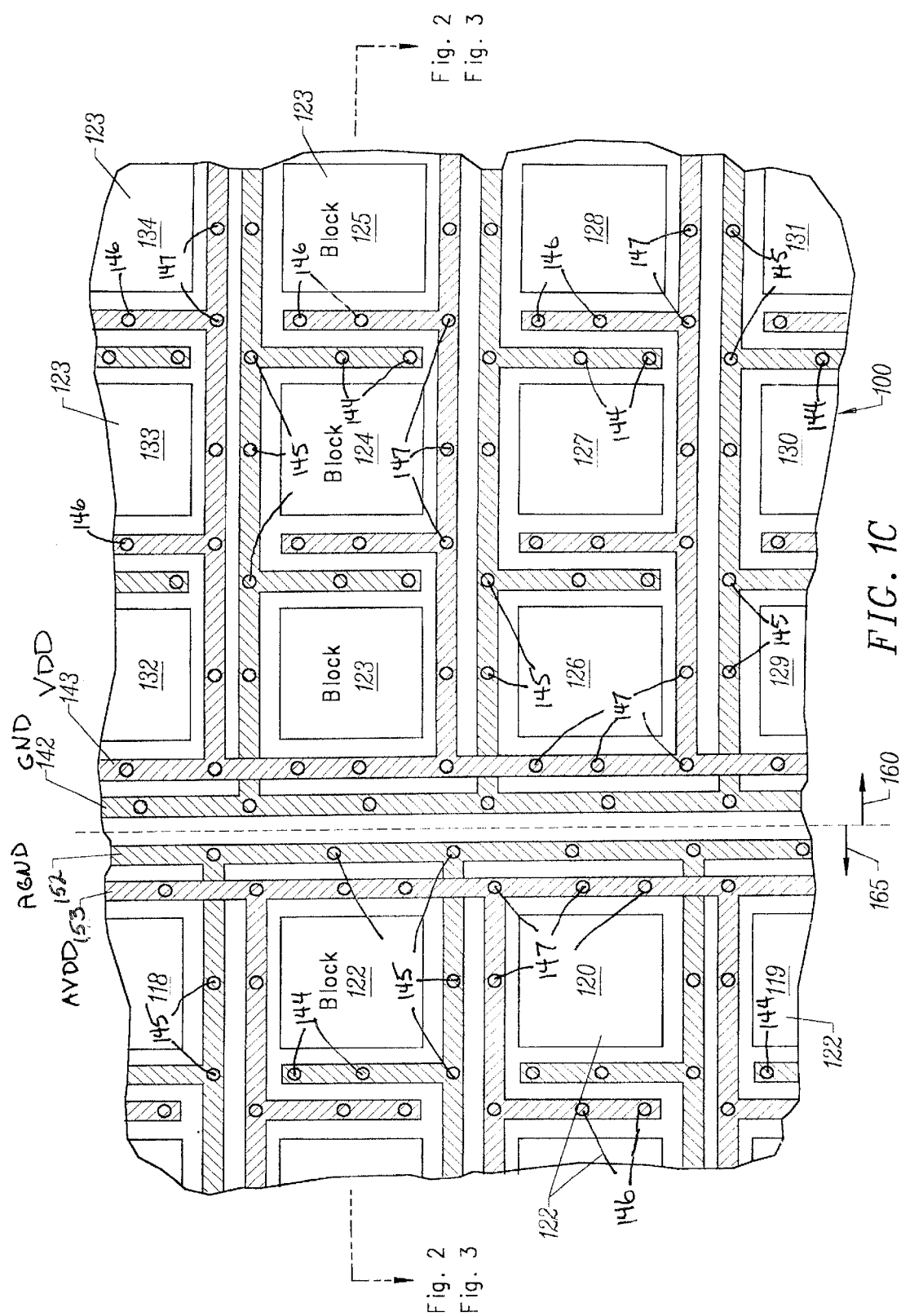
FIG. 1C illustrates overlying power and ground metal patterns for continuously interconnecting the isolating P+ and N+ guard mesh fingers and backbone configurations in accordance with the present invention.
Figure 2:
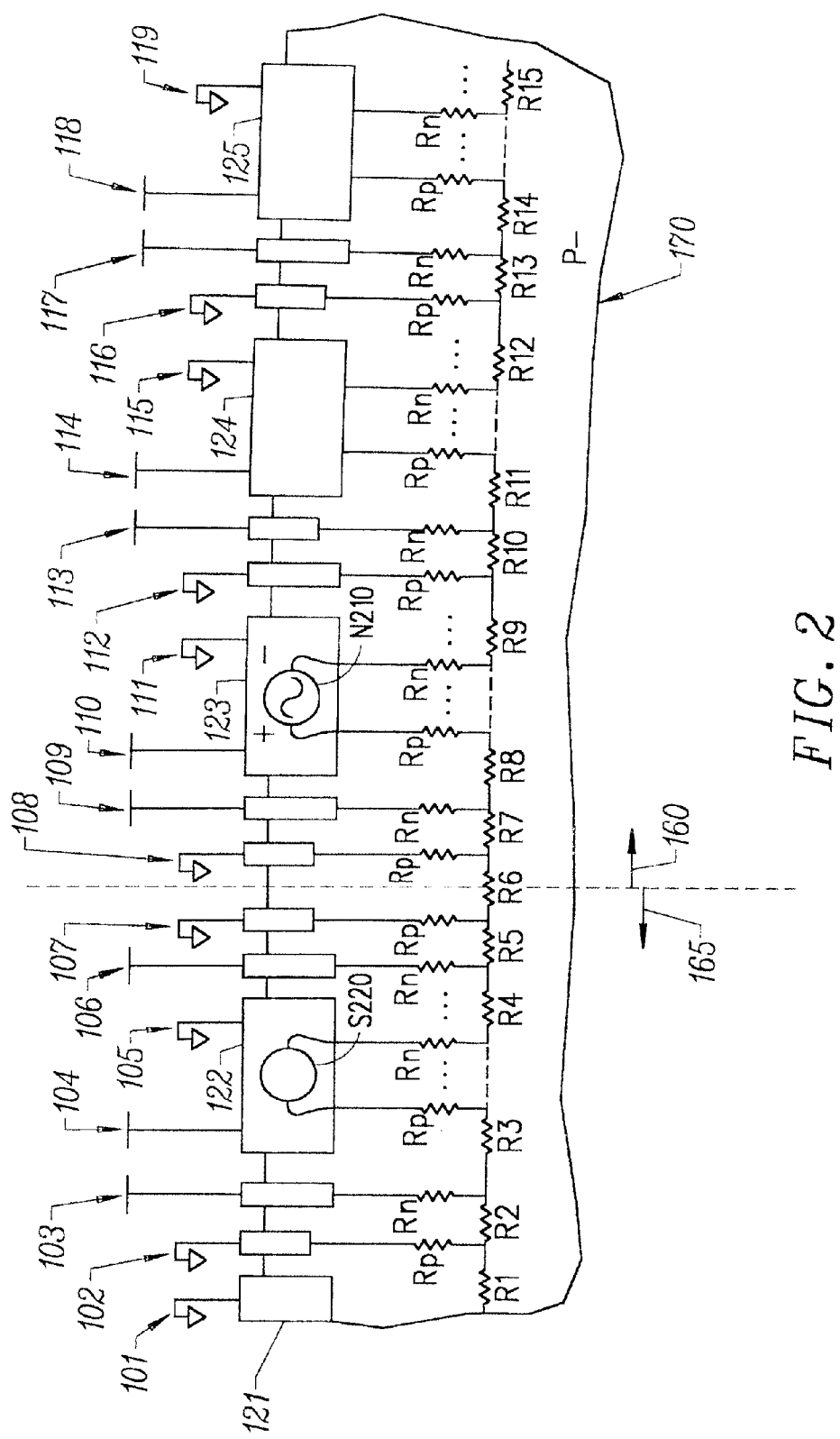
FIG. 2 is a circuit schematic representation of circuit elements in a cross sectional view of the die section depicted in FIG. 1A.

A VDD power distribution mesh 143, which is configured in the (one or more) metal layer(s) above the noisy region 160, is positioned above the N+ mesh 141 and is connected to it through a plurality of vertical contact openings, or vias, 146, 147 as illustrated in FIGS. 1B and 1C. Similarly, a ground distribution mesh 142 is configured and positioned above the P+ mesh 140 and is connected to it through a corresponding plurality of contact openings 144, 145. The number and placement of contact openings (or vias) 144–147 between N+/P+ guard meshes and the respective power/ground conductor metal distribution meshes are selected by means known to those skilled in the art such that a uniform voltage potential is maintained over the entirety of any P+ or N+ guard mesh within a region. The sufficiency of the uniformity of the voltage potential over the entirety of any particular P+ or N+ guard mesh within a region is related to the particular requirements of the specific Gm or Sm region in question. In either case, the respective guard mesh is said to have a solid electrically conducting tie to the corresponding power or ground mesh. To the extent that a continuous, sufficiently low impedance electrical connection must be maintained at every point along the extent of a guard mesh diffusion, the guard diffusion mesh and corresponding conductor metal mesh to which it is connected have substantially identical layout configurations in a region with the exception of short segments of power mesh metal overlying adjacent spaced apart ends of electrically common guard diffusions that have been separated to allow for the formation of other circuit features defined by the IC chip.

Figure 3:
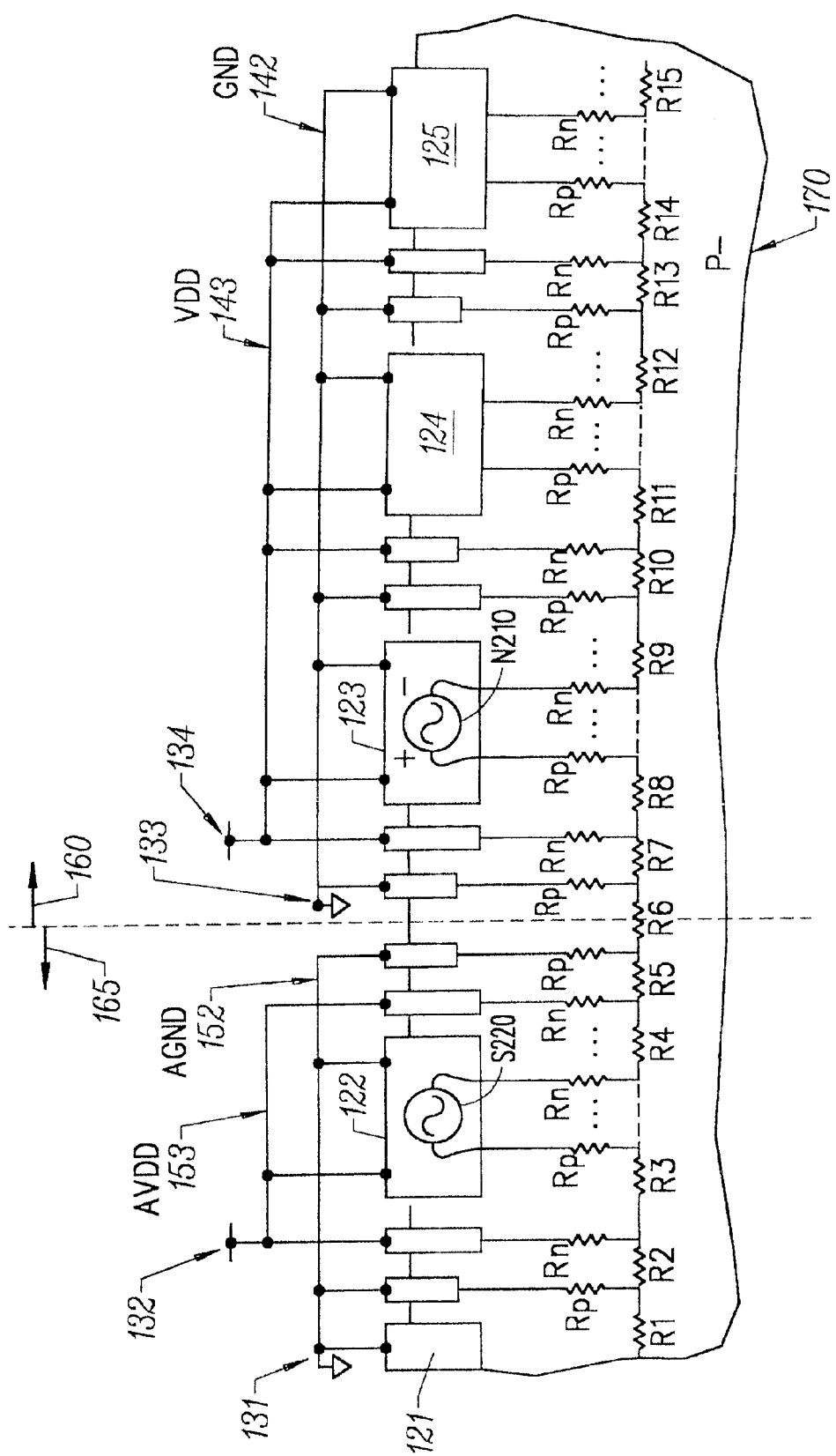
FIG. 3 is a circuit schematic representation of circuit elements in FIG. 2 to illustrate the circuit connection of a plurality of power distribution and ground distribution meshes (e.g., mesh fingers and backbones) for all circuit blocks and P+ and N+ guard mesh fingers and backbones of related noisy and noise sensitive regions to only one pair of device power pins for each region in FIGS. 1A–1C and 2.
Figure 4:
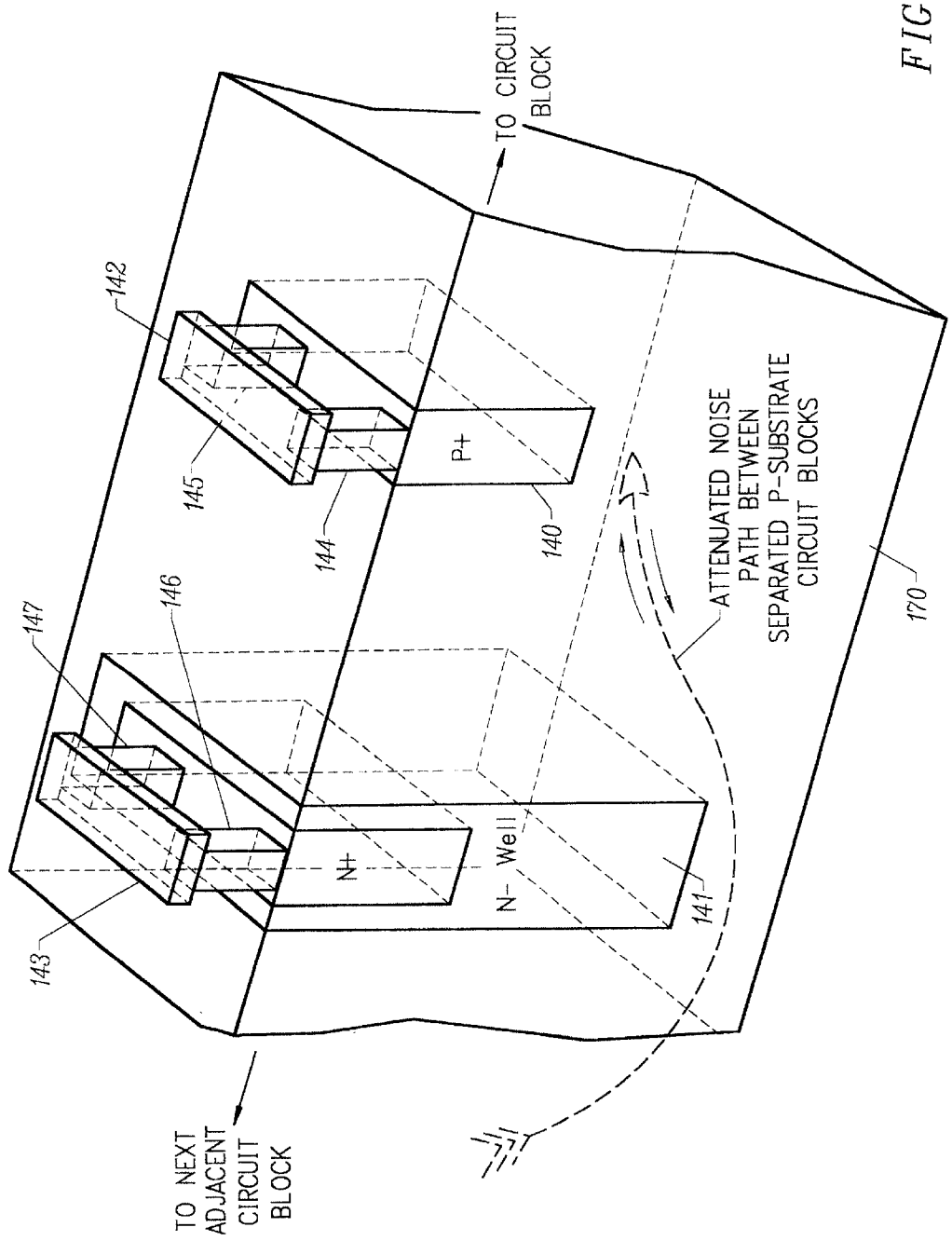
FIG. 4 illustrates a three dimensional view of the connection of the guard meshes of a region to the power and ground distribution meshes of the region.

In the noisy region 160, the VDD power distribution mesh 143 and the GND ground distribution mesh 142 provide the power and ground references for all circuit blocks 123–134 of the region and have solid electrically conducting ties to the diffused guard meshes below through the respective contact vias. Thus, both circuits and guard meshes of the noisy region 160 require only one external device ground connection pin 133 and power supply pin 134 as shown in FIG. 3. The associated electrical connections are illustrated in the schematic diagrams in FIG. 2 and FIG. 3 which represent a cross-sectional view of the die section defined in FIG. 1A. The P+ guard mesh maintains a solid tie to the ground mesh GND through contacts at 108, 112 and 116. The GND ground mesh provides the ground references 111, 115, and 119 for the noisy circuit blocks 123, 124, and 125 respectively, and connects to the external ground pin 133. Similarly the N+ guard mesh maintains a solid tie to the VDD power mesh through contacts 109, 113, and 117. The VDD power mesh distributes power to noisy blocks of the region using supply connections 110, 114, and 118 for the noisy circuits 123, 124, and 125 respectively, and connects to the external power supply pin 134.

The preceding description of the invention pertained to a noisy region 160 of the die 100. As illustrated in FIGS. 1A-3, the noise-sensitive region 165 is similarly constructed with guard meshes and power/ground meshes that are independent of those of the noisy region 160. Thus, P+ guard mesh 150 and N+ guard mesh 151 are embedded in the noise-sensitive region 165. An AGND ground distribution mesh 152 is positioned above, and has a solid tie to the P+ mesh 150 and an AVDD power distribution mesh 153 is positioned above, and has a solid tie to, the N+ mesh 143. The AGND ground reference mesh 152 of the noise-sensitive region 165 is independent of the GND ground reference mesh 142 of the noisy region 160, and the AVDD power supply mesh 153 of the noise-sensitive region 165 is independent of the power supply VDD 143 of the noisy region.

FIG. 3 illustrates that each region, whether noisy or noise-sensitive, requires only one pair of power/ground pins. The noisy region 160 utilizes external digital power supply pin connection 134 for the VDD mesh 143 digital power distribution to all circuit blocks 123, 124, 125, as well as to N+ mesh connections at contact points 109, 113, and 117. The noisy region utilizes external ground pin connection 133 for the GND ground distribution mesh 142 to all noisy circuit blocks 123, 124, 125 and to the P+ mesh at contact points 108, 112, and 116. Similarly, the noise-sensitive region 165 utilizes external analog power supply pin connection 132 for the AVDD mesh 153 analog power distribution to all circuit blocks 121, 122, as well as N+ guard mesh contact points 103 and 106 in the noise sensitive region. The noise-sensitive region 165 utilizes external ground pin connection 131 for AGND mesh analog ground reference to all circuit blocks 121, 122 and to the P+ guard mesh at contact points 102 and 107.

Referring again to FIG. 3 in combination with FIGS. 1A–1C and FIG. 2, noise generated in a noisy circuit block, for example, block 123, can be represented by a noise generator N210 coupling through spreading resistances Rp, Rn to the substrate P-region 170 in the noisy region 160. Similarly, in a noise-sensitive region, e.g., region 165, a noise sensitive block 122 can be represented with a noise-sensitive receiving circuit S220 coupled to the P-substrate 170 by corresponding spreading resistors Rp, Rn. The noise generator N210 generates noise signals (not shown) of a particular amplitude, e.g., a noise amplitude, |An(210)|. Each noise generating block Gm(j), j=123, 124, 125 - - - has an associated noise amplitude, |An(j)|, generated by each noisy circuit block 123, 124, or 125. The noise of each Gm block, Gm(h), j=123, 124,125 - - - is localized to that block (j) because residual noise propagating laterally in the substrate layer 170 along a substrate path to other blocks is suppressed by the P+ and N+ guard bands that both surround the noisy block.

In the noise-sensitive region, residual noise that impinges on a noise-sensitive block 121 or 122 is further attenuated by the P+ and N+ guard bands that both surround the block. At least two P+ guard bands and two N+ guard bands must be crossed by noise that propagates from any noisy block to any noise-sensitive block. Typically more guard bands are traversed depending on the degree of partition of a noise-sensitive region into noise sensitive blocks and partition of a noisy region into noisy blocks. From an examination of the schematic representations in FIGS. 2 and 3, it is clear to those skilled in the art that the total impedance along a noise propagation path from a noisy circuit block to a noise-sensitive block is increased by each guard band that is crossed since each guard band decreases the effective cross-sectional conduction area (perpendicular to the surface of the substrate) by the depth of the respective guard band diffusion into the substrate. In addition, each P+ and N+ guard band serves as a local low impedance path to a noise sink represented by the power and ground reference ties. See FIG. 4.

The use of power and ground distribution meshes in highly integrated semiconductor devices is itself a recent trend in semiconductor devices because of the benefits of uniform distribution of power and ground over such semiconductor devices. Therefore the novel use of the power/ground distribution meshes by the present substrate noise reduction invention is an additional benefit which does not impose significant additional complexity in modem highly integrated semiconductor devices. The manufacturing processes required for implementation of the guard mesh and associated ties to the power/ground meshes are inexpensive conventional processes.

The preceding description of the invention is illustrative and some obvious variations in layout of guard mesh and power/ground distribution meshes are possible. For the layout of FIGS. 1A to 3, noise propagating from a noisy circuit block 123, 124, or 125 to a noise-sensitive block 121 or 123 must cross at least two P+ and two N+ guard bands.

Figure 5A:
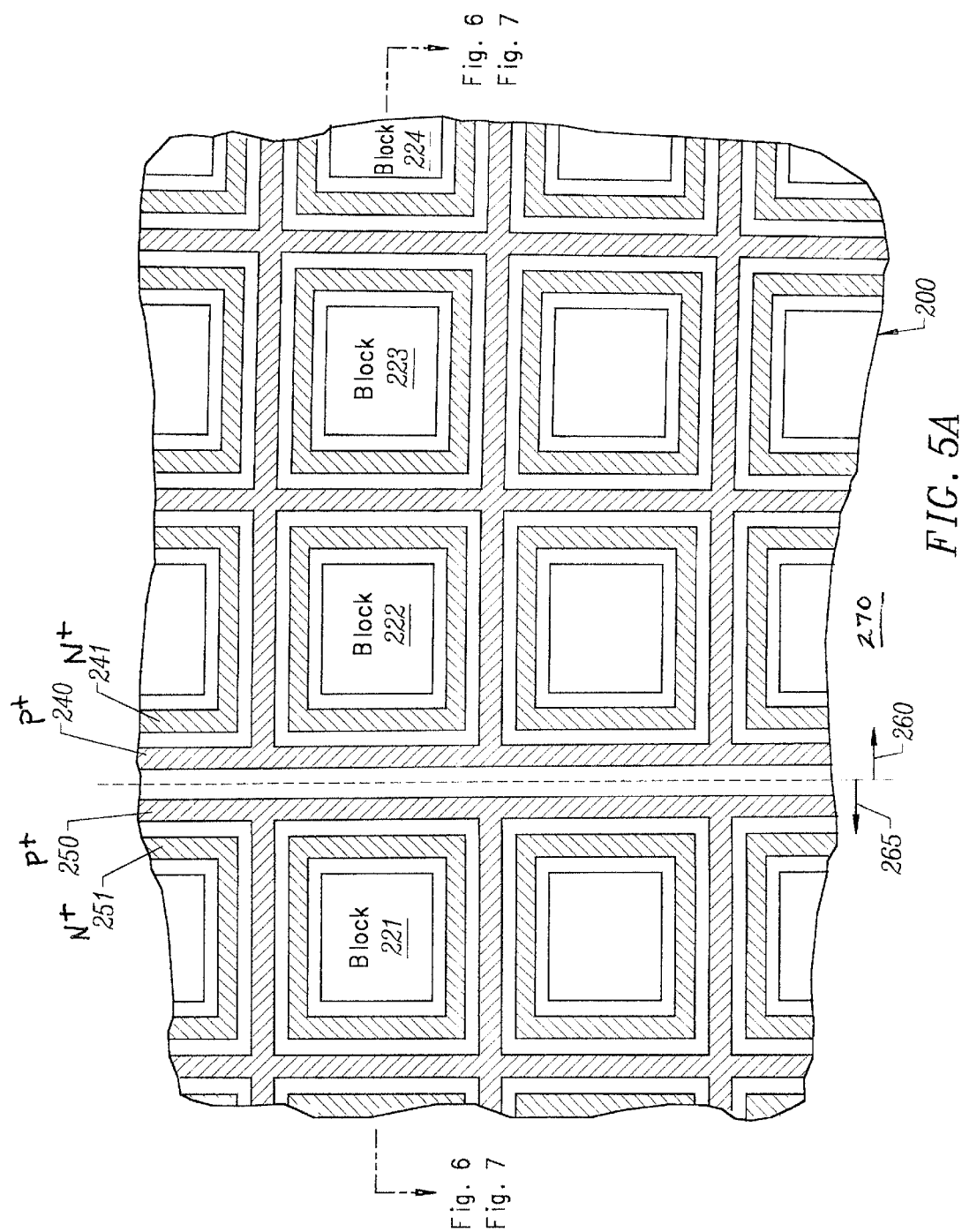
FIG. 5A illustrates a representative section of the die showing an alternative layout of guard mesh configurations in accordance with the present invention.
Figure 5B:
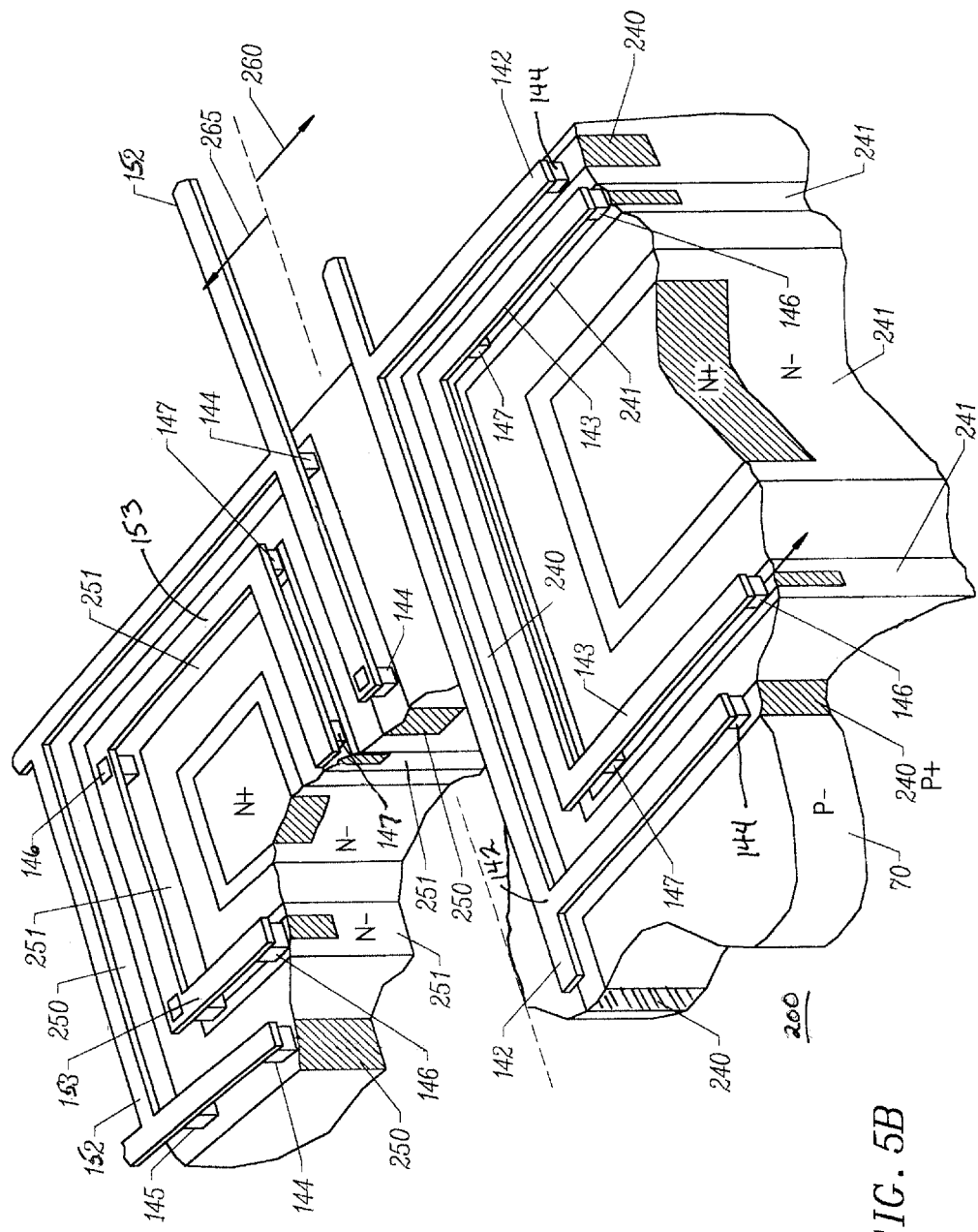
FIG. 5B shows a three dimensional partially cut-away representation of a noisy circuit region separated from a noise-sensitive circuit region by one guard mesh configuration in accordance with the present invention.
Figure 6:
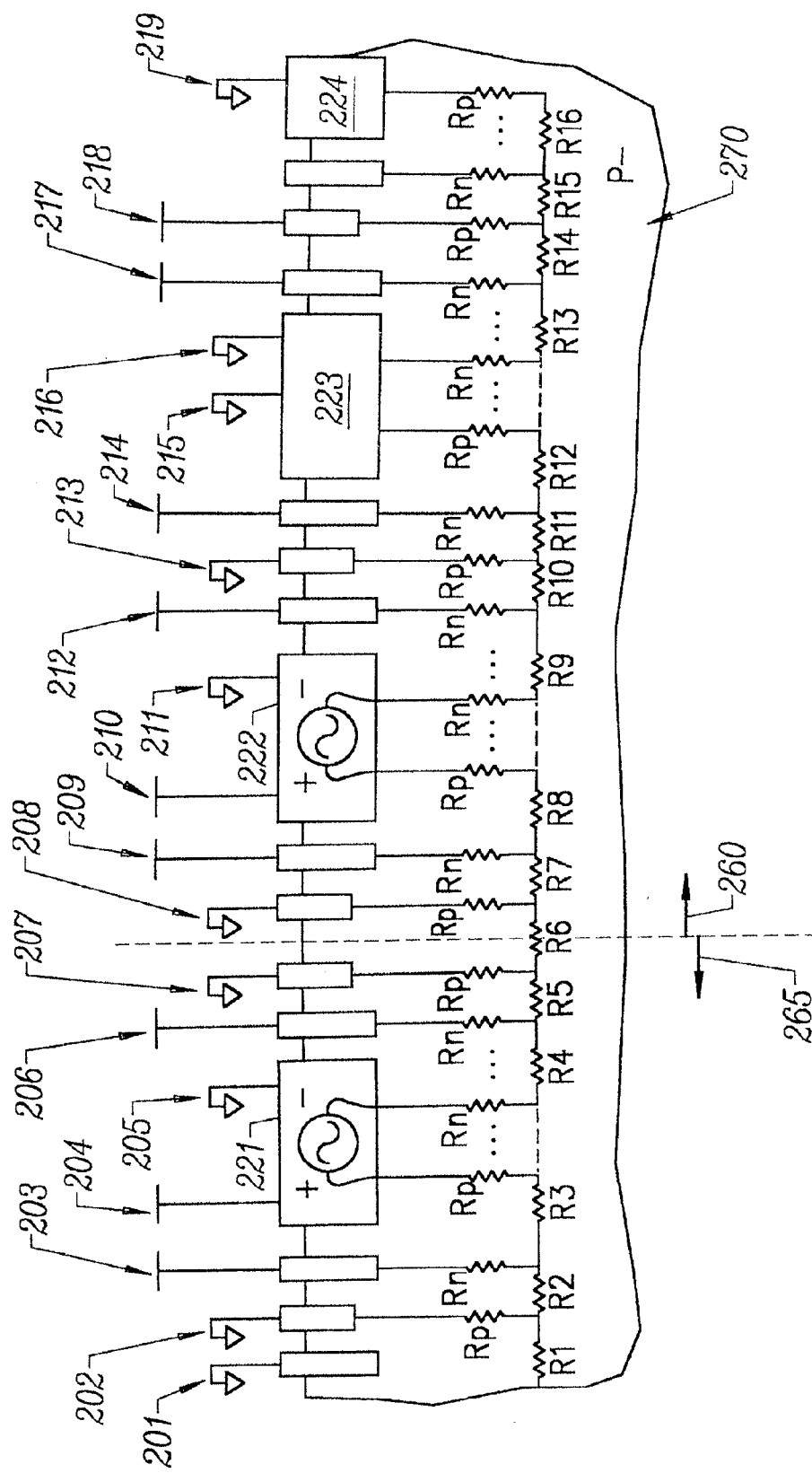
FIG. 6 is a circuit schematic representation of circuit elements in a cross sectional view of the die section of FIG. 5A.
Figure 7:
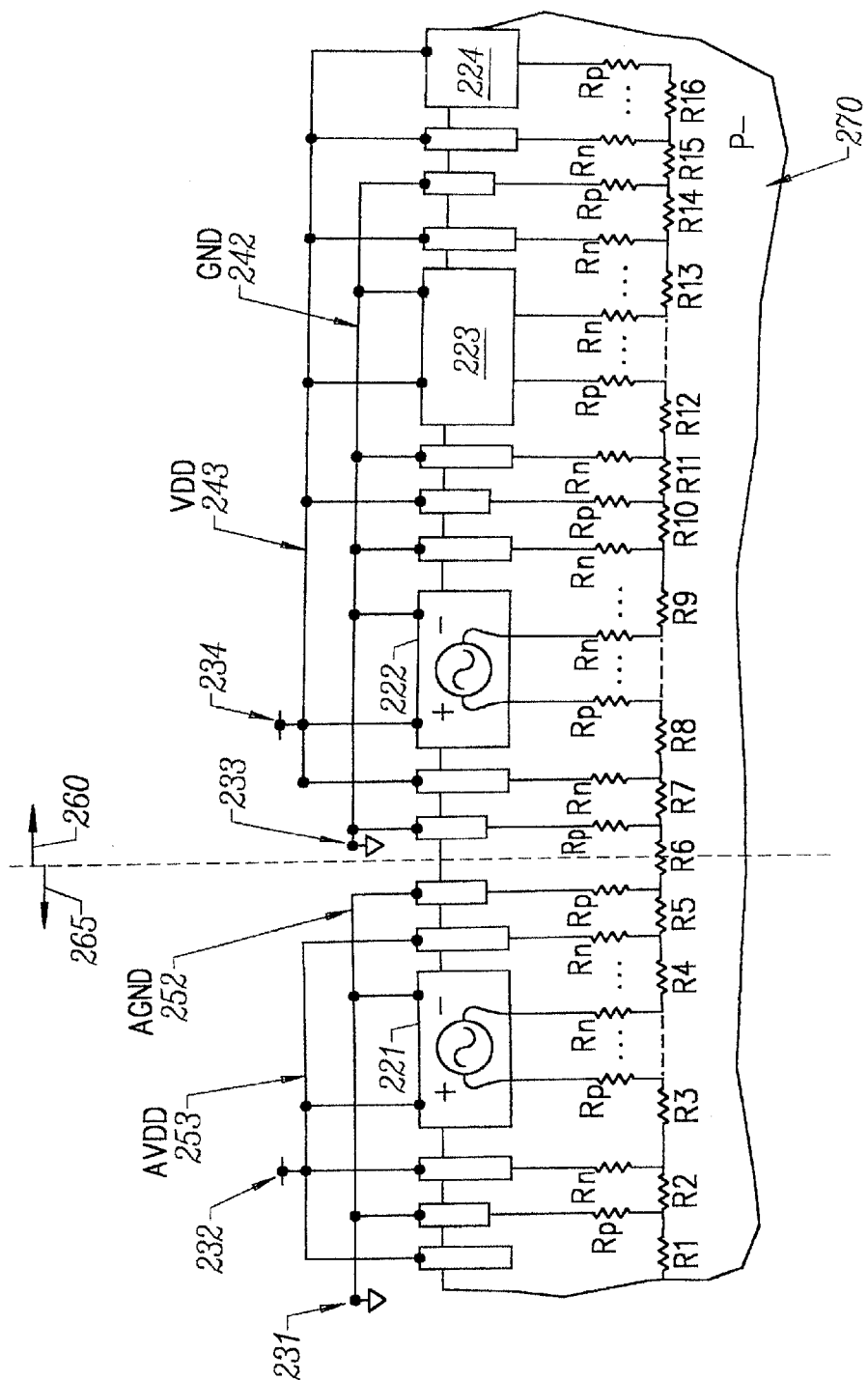
FIG. 7 is a circuit schematic representation of circuit elements to illustrate the connection of power distribution and ground distribution meshes for all circuit blocks and P+ and N+ guard meshes of a region to only one pair of device power pins in FIGS. 5A, 5B and 6.
Figure 8:
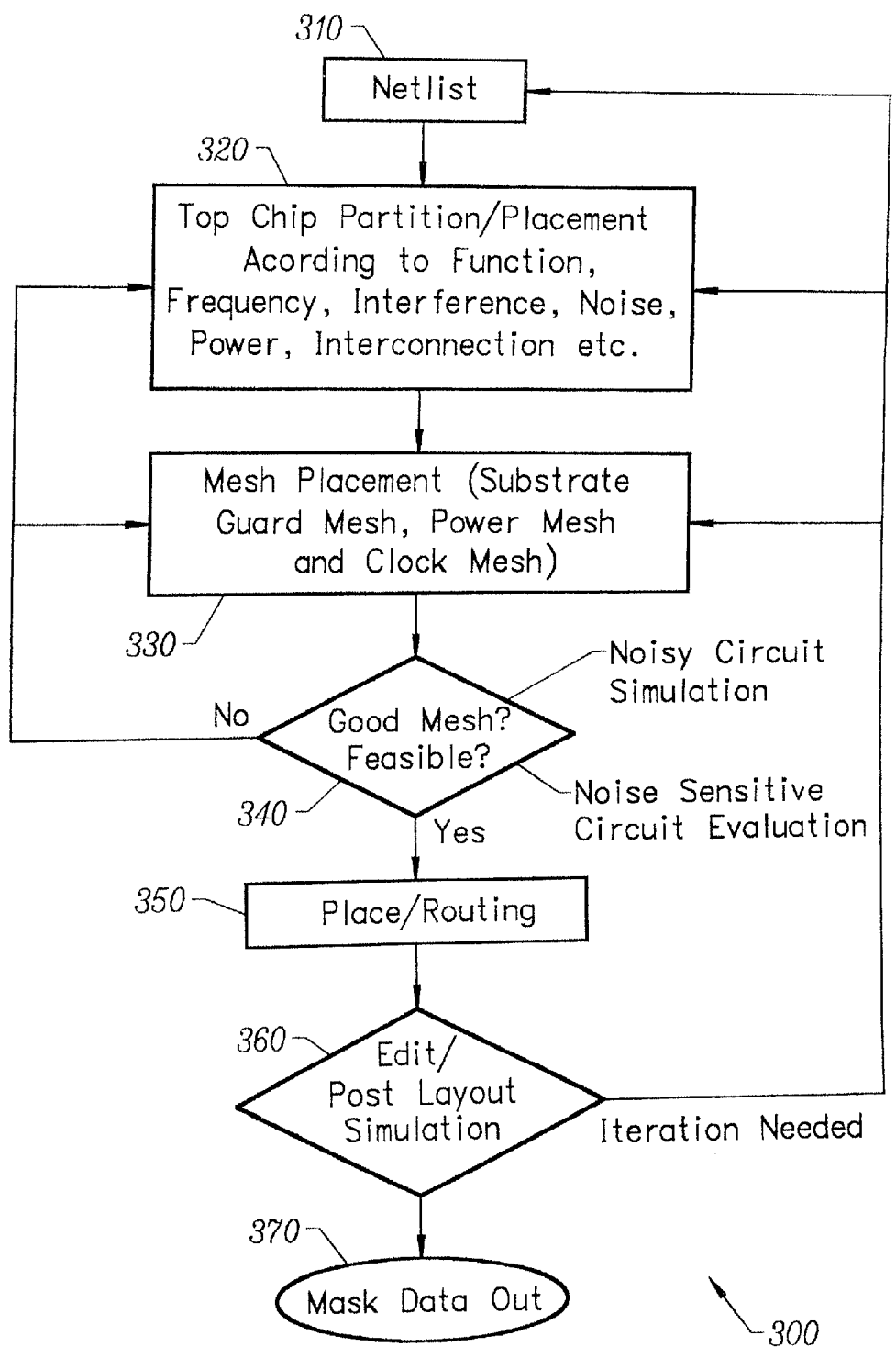
FIG. 8 illustrates a flow chart of a process that may be used to implement the isolation techniques on an integrated circuit according to embodiments of the invention.

FIGS. 5 to 7 show an alternative layout of guard meshes providing more N+ guard bands and hence more substrate noise suppression at the cost of more overhead in occupancy of die area by the N+ guard meshes. FIG. 5 illustrates a representative section of a semiconductor die 200 with a P-substrate 270. A plurality of noisy circuit elements or blocks with representative blocks 222–224 are laid out on a noisy region 260 of the die, and a plurality of noise-sensitive blocks with a representative block 221 are laid out on an adjacent noise-sensitive region 265 of the die. A mesh 240 of P+ guard bands and a mesh 241 of N+ guard bands are embedded in the substrate of the noisy region 265 as shown in FIG. 5 such that each circuit block is completely enclosed around its perimeter by an N+ guard mesh which is in turn completely enclosed around its perimeter by a P+ guard mesh. Analogous to the example of FIGS. 1A–1C, the P+ mesh 240 has a solid electrical contact to a GND ground distribution mesh above it by a plurality of contact vias defined through respective insulating layers between the guard diffusions and the metal overlays. Similarly, the N+ mesh 241 has a solid tie to a VDD power distribution mesh above it. The substrate resistances R in FIGS. 6 and 7 generally have differing resistance values from that of FIGS. 2 and 3.

Generally, the size and shape of noisy circuit blocks and noise-sensitive circuit blocks are not uniform so that the structure of the guard meshes are not as regular as depicted in FIGS. 1A–1C and 5A, e.g., not orthogonal. The representative die sections depicted in FIGS. 1A–1C and 5A show only one noisy region and one noise sensitive region but in modern highly integrated circuits there will be K noise sensitive regions and M noisy regions placed on a semiconductor die, where K and M are typically larger than one. Each region, whether a noisy region or noise-sensitive region, has a dedicated power distribution mesh and ground distribution mesh independent of the meshes of the other regions on the die. Each region has dedicated P+ and N+ meshes (formed in N-well regions) with the N+ mesh tied to the power distribution mesh and P+ mesh tied to the ground distribution mesh. Thus, there are M+K each of independent power distribution meshes, ground distribution meshes, P+ guard meshes, and N+ guard meshes on the die. As, a numerical example, a highly integrated system on a chip containing analog and digital processing functions may have M=4 noisy regions containing digital circuits and K=3 noise sensitive regions containing analog circuits. In the example, a total of 14 external device pins would suffice for the ground references and power supplies for all circuits and guard meshes.

In the present context, noisiness and noise sensitivity have not only a magnitude component but also a frequency component. That is, analog circuits tend to be sensitive to digital circuit noise in certain frequency ranges. For this reason, partition of noise sensitive regions and noisy regions are often on the basis of frequency sensitivity or noise emission frequency respectively. The relative degree of noisiness and noise sensitivity have a bearing on the relative placement of the M+N regions on the die substrate and the relative placement of the circuit blocks within each region in ways that are known to those skilled in the art. For example, as a general rule the noisiest and most noise-sensitive regions are typically placed at opposite sides of the die. Within a noise sensitive region, the most noise sensitive block is typically situated as far as possible from a neighboring noisy region.

The present invention provides for an apparatus and method for producing a semiconductor die containing highly integrated functionality with the object of improved substrate noise reduction using guard bands. A further object of the invention is minimal overhead requirement in the number of external power or ground pins for the noise reduction function. The implementation of the invention may utilize conventional automated design tools for semiconductor devices in accordance with the logic flow diagram 300 shown in FIG. 8. The method begins with an initial net list 310 for the circuitry. The next step 320 is circuit partition and placement on the die. Initially the circuits are partitioned according to noise characteristics, i.e., either noisy circuits (typically digital circuits) or noise-sensitive (typically analog circuits). Then the circuits are further partitioned by other criteria, such as interference frequency or frequency of interference susceptibility, noise generation level, power requirements, interconnection requirements, etc. The next step 330 is the mesh placement which results in the partition into regions where circuits of a region that share common power mesh, ground mesh, and guard meshes P+ and N+. The mesh fine structure defines the individual circuit blocks.

In step 340 the resultant mesh layout is tested for adequacy by such criteria, such as die space utilization efficiency, estimated adequacy of noise isolation for noise sensitive blocks by the simulation of noise generators and subsequent response of sensitive circuit functions based on the attenuation provided by the structure of the present invention, and feasibility of implementation on the target die size. If the mesh layout is unsatisfactory with respect to the criteria for adequacy, the method 300 returns to chip circuit partition/placement step 320 or mesh placement step 330. Otherwise, the mesh layout is satisfactory and the method continues with the conventional design step 350 of place and route, and then step 360 of editing and post-layout simulation. Unless the simulation indicates a need for iteration on the netlist at step 310, the final step 370 yields mask data output for production of the highly integrated semiconductor device with improved substrate noise isolation in accordance with the present invention.

Therefore, while the description above provides a full and complete disclosure of the preferred embodiments of the present invention, various modifications, alternate constructions, and equivalents will be obvious to those with skill in the art. Thus, the scope of the present invention is limited solely by the metes and bounds of the appended claims.

What is claimed is:

1. A method of designing an integrated circuit for manufacture at and on a semiconductor substrate die surface, said method comprising partitioning and placing circuitry of said integrated circuit according to noise characteristics of said circuitry from a netlist of said integrated circuit;

further partitioning said circuitry into circuit blocks sharing power supplies, said circuit blocks having first and opposite conductivity type diffusion guard band meshes disposed therearound, and defining metal power supply meshes for said circuit blocks to substantially overlie said first conductivity type diffusion guard band meshes and said opposite conductivity type diffusion guard band meshes for intimate electrical contact with and along said first conductivity type and opposite conductivity type diffusion guard band meshes;

testing said partitioned circuitry against predetermined criteria; and repeating said partitioning step and said further partitioning and defining step selectively responsive to failure of said partitioned circuitry against said predetermined criteria until said partitioned circuitry passes said predetermined criteria.

2. The method according to claim 1 wherein said further partitioning and defining step comprises disposing a plurality of spaced apart contact vias through insulating layers between said metal power supply meshes and said first and opposite conductivity type diffusion guard band meshes so that said metal power supply meshes are in intimate electrical contact along said first and opposite conductivity type diffusion guard band meshes.

3. The method according to claim 2 wherein said further partitioning and defining step comprises defining said metal power supply meshes irregularly over a totality of said substrate die surface.

4. The method according to claim 3 wherein said predetermined criteria in said testing step comprises die space utilization efficiency.

5. The method according to claim 3 wherein said predetermined criteria in said testing step comprises noise isolation adequacy by simulating noise generation by selected circuit blocks and corresponding response to said noise generation by other selected circuit blocks.

6. The method according to claim 3 wherein said noise characteristics comprise separation of said circuitry into noise generating and noise sensitive circuits.

7. The method according to claim 6 wherein said noise characteristics further comprise frequencies of interference susceptibility, noise generation levels, power requirements and interconnection requirements.

8. The method according to claim 3 further comprising placing and routing elements of said circuit blocks; and editing and simulating operation of said elements of said circuit blocks.

9. The method according to claim 8 further comprising revising said netlist if said simulating operation of said elements indicates unsatisfactory operation of said circuit blocks; and repeating said partitioning, further partitioning and defining, testing and selective repeating said partitioning step and said further partitioning steps.

* * * * *